United States Patent
Taghizadeh Kaschani

(10) Patent No.: US 10,896,906 B2
(45) Date of Patent: Jan. 19, 2021

(54) CIRCUIT OVERVOLTAGE PROTECTION

(71) Applicant: TEXAS INSTRUMENTS INCORPORATED, Dallas, TX (US)

(72) Inventor: Karim Thomas Taghizadeh Kaschani, Freising (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 421 days.

(21) Appl. No.: 15/827,975

(22) Filed: Nov. 30, 2017

(65) Prior Publication Data

US 2019/0164953 A1 May 30, 2019

(51) Int. Cl.
| | |
|---|---|
| *H02H 9/04* | (2006.01) |
| *H01L 27/02* | (2006.01) |
| *G01R 31/00* | (2006.01) |
| *H02H 9/06* | (2006.01) |

(52) U.S. Cl.
CPC ........ *H01L 27/0292* (2013.01); *G01R 31/002* (2013.01); *H01L 27/0255* (2013.01); *H01L 27/0266* (2013.01); *H01L 27/0285* (2013.01); *H02H 9/046* (2013.01); *H02H 9/04* (2013.01); *H02H 9/044* (2013.01); *H02H 9/06* (2013.01)

(58) Field of Classification Search
USPC .......................................... 361/56, 91.1, 111
See application file for complete search history.

(56) References Cited

U.S. PATENT DOCUMENTS

| | | | | |
|---|---|---|---|---|
| 5,347,185 | A * | 9/1994 | Tailliet | H01L 27/0251 326/21 |
| 5,901,022 | A * | 5/1999 | Ker | H01L 23/5227 361/111 |
| 6,125,021 | A * | 9/2000 | Duvvury | H01L 27/0266 361/56 |
| 7,298,599 | B1 * | 11/2007 | Vashchenko | H01L 27/0266 361/56 |
| 2009/0073620 | A1 * | 3/2009 | Mergens | H01L 27/0251 361/56 |
| 2019/0148936 | A1 * | 5/2019 | Hsin | H02H 9/044 361/56 |

\* cited by examiner

*Primary Examiner* — Danny Nguyen
(74) *Attorney, Agent, or Firm* — Rose Alyssa Keagy; Charles A. Brill; Frank D. Cimino

(57) ABSTRACT

An electrostatic discharge (ESD) protection circuit includes a snapback ESD protection device and an ESD tail current clamp circuit. The snapback ESD protection device is configured to shunt current of an ESD event to a voltage reference. The ESD tail current clamp circuit is connected in parallel with the snapback ESD protection device. The ESD tail current clamp circuit is configured to shunt tail current of the ESD event to the voltage reference while the snapback ESD protection device is disabled.

16 Claims, 2 Drawing Sheets

CIRCUIT OVERVOLTAGE PROTECTION

BACKGROUND

Integrated circuits (ICs) may be severely damaged by electrostatic discharge (ESD) phenomena. An IC may be exposed to ESD from many sources. A major source of ESD exposure to ICs is from the human body, and is known as the Human Body Model (HBM) ESD source. A charge of about 0.2 micro-coulombs can be induced on a body capacitance of 100 pF, leading to electrostatic potentials of 2 kV or greater. Any contact by a charged human body with a grounded object, such as a terminal of an IC, can result in a discharge for about 100 nano-seconds with peak currents of several amperes to the IC.

A second ESD model is the charged device model (CDM). Unlike the HBM ESD source, the CDM ESD source includes situations where the IC itself becomes charged and discharges to ground when any of its pins makes contact to a grounded conductive object. Thus, a CDM discharge requires only one IC pin to be contacted, whereas a HBM discharge requires at least two IC pins to be contacted. CDM pulses also have very fast rise times compared to the HBM ESD source.

Because of high electrostatic voltages resulting in large ESD currents on the one hand and low breakdown voltages of IC components on the other hand, the problem of ESD with IC components can be severe. Therefore, the terminals of an IC usually have an integrated protection device connected between the terminal and the internal circuits which allows the ESD current to be shunted to an alternative voltage source, e.g., ground, to clamp the induced overvoltage and protect the active internal circuits from damage.

SUMMARY

An electrostatic discharge (ESD) protection circuit that protects an electronic device from voltage generated by tail current of an ESD event is disclosed herein. In one embodiment, an electronic circuit includes an electronic device, a snapback ESD protection device, and an ESD tail current clamp circuit. The electronic device includes an input/output (I/O) terminal to receive an input signal or provide an output signal. The snapback ESD protection device is coupled to the I/O terminal. The tail current clamp circuit is connected in parallel with the snapback ESD protection device. The tail current clamp circuit is configured to shunt tail current of an ESD event to a voltage reference.

In another embodiment, an ESD protection circuit includes a snapback ESD protection device and a tail current clamp circuit. The snapback ESD protection device is configured to shunt current of an ESD event to a voltage reference. The tail current clamp circuit is connected in parallel with the snapback ESD protection device. The tail current clamp circuit is configured to shunt tail current of the ESD event to the voltage reference while the snapback ESD protection device is disabled.

In a further embodiment, a tail current clamp circuit includes a shunt transistor and a first control transistor. The shunt transistor is configured to shunt a tail current of an ESD event to a voltage reference. The first control transistor is coupled to a control terminal of the shunt transistor. The first control transistor is configured to drive a pulse onto the control terminal of the shunt transistor responsive to the ESD event. The shunt transistor and the first control transistor are configured to route a voltage induced on the control terminal via the pulse to the voltage reference via a body diode of the first control transistor and a drain-source channel of the shunt transistor. The shunt transistor is configured to remain active responsive to an ESD induced voltage exceeding a threshold voltage of the shunt transistor less a voltage drop across a body diode of the first control transistor.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

In integrated circuits (ICs), snapback devices are often utilized to protect IC circuitry from electrostatic discharge (ESD). In some ICs (e.g., ICs that include high impedance input or output terminals), the tail current of an ESD event that flows after a snapback device turns off can induce a relatively high voltage on the structures connected to the high impedance terminals. In some cases, the voltage induced by the tail current can be high enough to damage circuit elements connected to the high impedance terminals.

Embodiments of the present disclosure include ESD protection circuits that protect circuit elements connected to high impedance terminals from tail current induced overvoltages. Embodiments include a tail current clamp circuit disposed in parallel with a snapback device. The tail current clamp circuit is triggered by an ESD event and remains active after the snapback device is turned off to shunt the tail current to a voltage reference (e.g., to ground), thereby reducing the voltage induced by the tail current. Thus, by inclusion of the tail current clamp circuit, embodiments prevent tail current induced overvoltages that may otherwise damage components of an IC.

Figure 1:
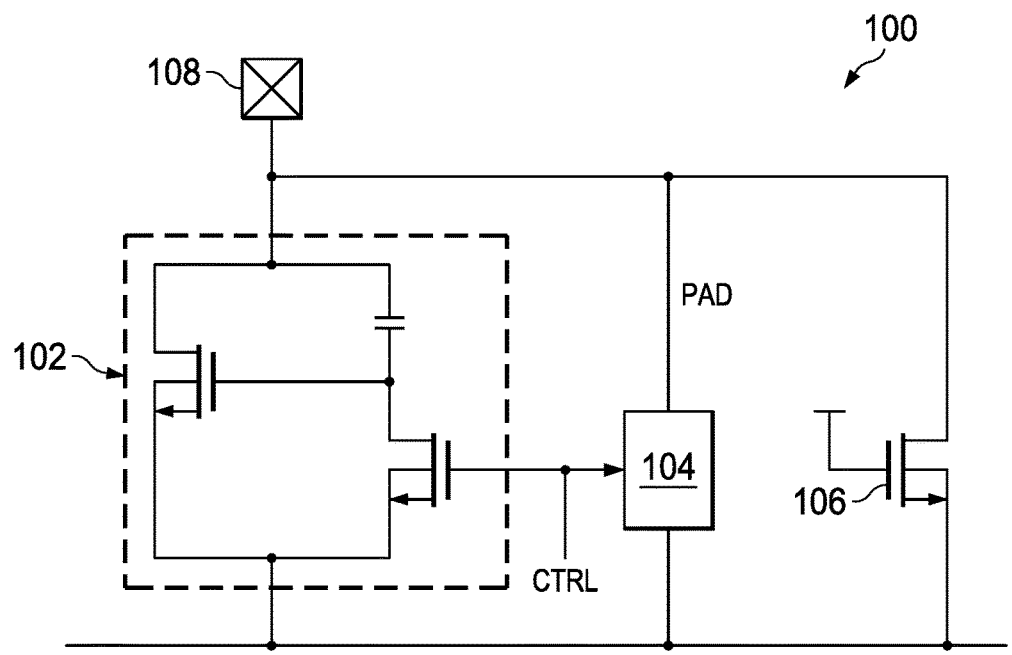
FIG. 1 shows a block diagram of a system that includes an electrostatic discharge (ESD) tail current clamp in accordance with various embodiments.

FIG. 1 shows a block diagram of a system 100 that includes an electrostatic discharge (ESD) tail current clamp circuit in accordance with various embodiments. The system 100 includes an Input/Output (I/O) terminal 108, an I/O device 106, a snapback ESD protection device 102, and an ESD tail current clamp circuit 104. The I/O terminal 108 is a port through which electrical signals enter and/or exit the system 100. In some embodiments, the I/O terminal 108 may be a power supply terminal. The system 100 may be an integrated circuit. The I/O device 106 may drive the I/O terminal 108 and/or receive a signal from the I/O. In FIG. 1, the I/O device 106 is illustrated as a transistor that drives the I/O terminal 108 via an open-drain configuration. In some embodiments of the system 100, a gate terminal of a transistor may be coupled to the I/O terminal 108 to receive input signal. Embodiments of the system 100 may include any number of additional transistors and other components coupled to the I/O device 106 to provide a desired function, and may include any number of I/O devices 106 to provide input and/or output of signals to/from the system 100. An instance of the snapback ESD protection device 102, and the ESD tail current clamp circuit 104 may be coupled to each I/O device 106.

The snapback ESD protection device 102 is coupled to the I/O terminal 108 in parallel with the I/O device 106. In various embodiments, the snapback ESD protection device 102 is a metal oxide semiconductor field effect transistor (MOSFET), a bipolar transistor (BJT) or a silicon-controlled rectifier (SCR). If an ESD event causes voltage at the I/O terminal 108 to rise above the threshold voltage of the snapback ESD protection device 102, then the snapback ESD protection device 102 is activated to shunt current from the I/O terminal 108 to a reference voltage (e.g., ground). Unfortunately, after the snapback ESD protection device 102 turns off, the tail current of the ESD event can cause the voltage on the I/O terminal 108 to rise. If the voltage induced by the tail current exceeds the break-down voltage of the I/O device 106, then the I/O device 106 may be damaged. The tail current clamp circuit 104 reduces the likelihood of damage to the I/O device 106 caused by tail current induced overvoltage.

The ESD tail current clamp circuit 104 is coupled to the I/O terminal 108 in parallel with the I/O device 106 and the snapback ESD protection device 102. The ESD induced rise in voltage at the I/O terminal 108 that activates the snapback ESD protection device 102 also activates the ESD tail current clamp circuit 104. More generally, the ESD tail current clamp circuit 104 is activated any time before the snapback ESD protection device 102 turns off (e.g., after ESD current starts to flow into the I/O terminal 108 and before the snapback ESD protection device 102 turns off). After the snapback ESD protection device 102 is deactivated, the ESD tail current clamp circuit 104 remains active to shunt the tail current to the reference voltage. Thus, the ESD tail current clamp circuit 104 limits the ESD induced voltage across the I/O device 106 after the snapback ESD protection device 102 turns off. The ESD tail current clamp circuit 104 may remain active until ESD tail current is no longer flowing.

While the snapback ESD protection device 102 and the ESD tail current clamp circuit 104 are illustrated as separate circuits in FIG. 1, in some embodiments of the system 100, the ESD tail current clamp circuit 104 may be incorporated in the snapback ESD protection device 102. In some embodiments of the system 100, the ESD tail current clamp circuit 104 may be incorporated in circuitry that includes the I/O device 106.

Figure 2:
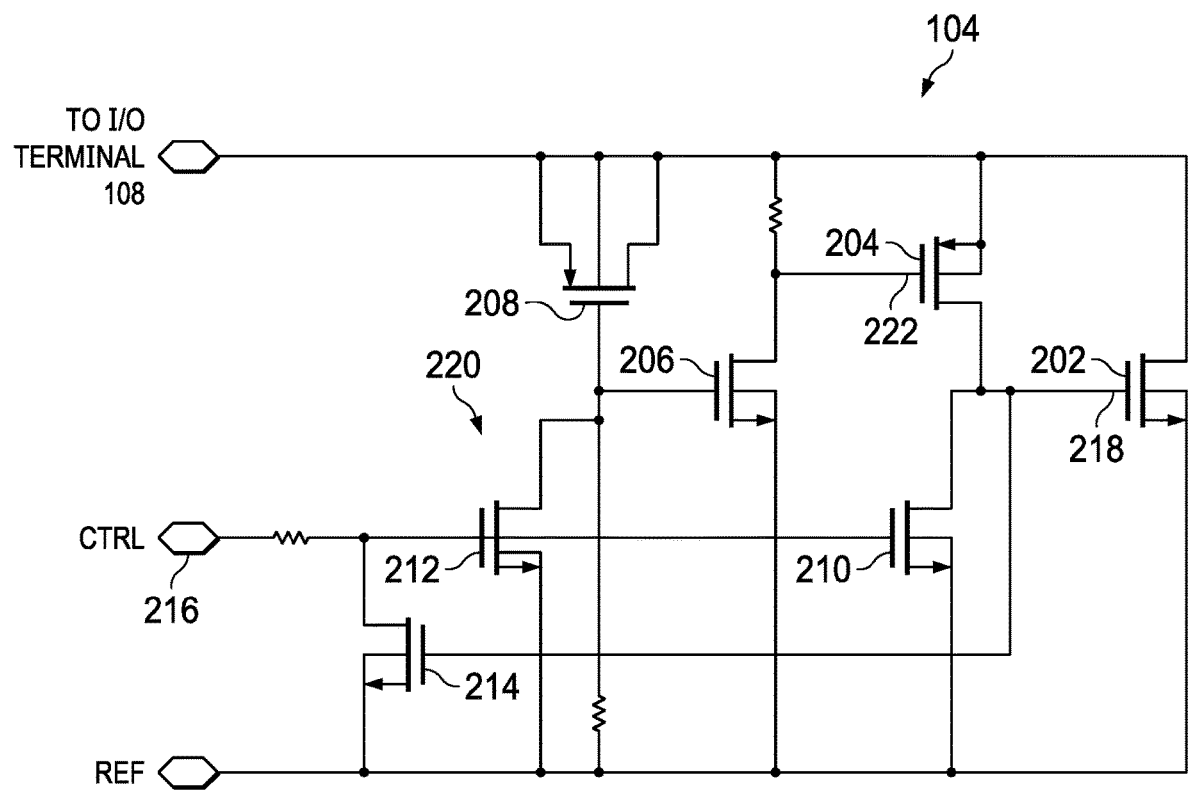
FIG. 2 shows a schematic diagram of an ESD tail current clamp circuit in accordance with various embodiments.

FIG. 2 shows a schematic diagram of an ESD tail current clamp circuit 104 in accordance with various embodiments. The ESD tail current clamp circuit 104 includes a shunt transistor 202, shunt control transistors 204, 206, and 208, control circuitry 220 that includes transistors 210, 212, and 214, and a control terminal 216. The control terminal 216 allows for input of control signal to the control circuitry. The shunt transistor 202 switches ESD tail current from the I/O terminal 108 to the reference voltage. Because the shunt transistor 202 alone conducts only the ESD tail current (e.g., the holding current of the snapback ESD protection device 102) the size of the shunt transistor 202 may be reduced relative to a bypass transistor of the snapback ESD protection device 102. The transistors of the snapback ESD protection device 102 may be MOSFETs.

The shunt transistor 202 is activated to conduct ESD current by the shunt control transistors 204, 206, and 208. The transistor 208 is connected to operate as a capacitor. An ESD voltage pulse on the I/O terminal 108 produces a voltage pulse on the control terminal of the transistor 206 via the transistor 208. Thus, The ESD voltage pulse on the I/O terminal 108 activates the transistor 206, which in turn activates the transistor 204. A current pulse flowing through transistor 204 charges the control terminal 218 (e.g., the gate terminal) of the shunt transistor 202, thereby activating the shunt transistor 202 to conduct ESD current.

While both the ESD tail current clamp circuit 104 and the snapback ESD protection device 102 are activated by an ESD voltage pulse on the I/O terminal 108, the ESD tail current clamp circuit 104 remains active after the snapback ESD protection device 102 is deactivated. The shunt transistor 202 may remain active while the voltage on the I/O terminal 108 is greater than the threshold voltage of the shunt transistor 202 less the voltage drop across a body diode of the transistor 204 (i.e., $V_{ESD}>V_{T(202)}-V_{Dio(204)}$). The shunt transistor 202 remains active while the control terminal 218 is charged. The control terminal 218 discharges through the body diode of the transistor 204 and the drain-source channel of the shunt transistor 202.

The control circuitry 220 enables and disables the ESD tail current clamp circuit 104 responsive to a control signal received via the control terminal 216. If the control signal is asserted, then transistors 212 and 210 are activated, which in turn disables activation of the transistors 206 and 204, and the shunt transistor 202, thereby disabling the ESD tail current clamp circuit 104. While the control terminal 218 of the shunt transistor 202 is charged (i.e., while the shunt transistor 202 is active) the transistor 214 prevents the control signal received via the control terminal 216 from disabling the ESD tail current clamp circuit 104.

Figure 3A:
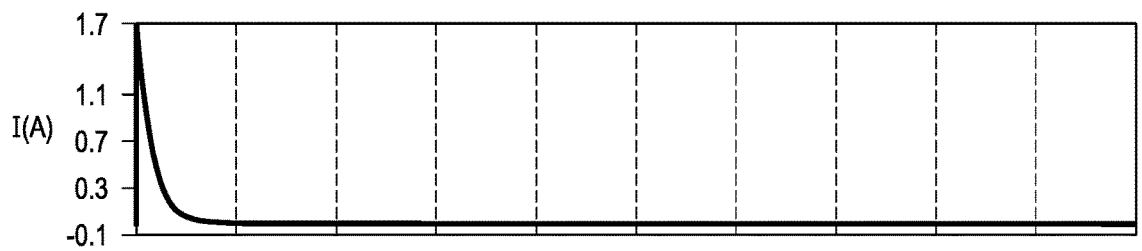
FIGS. 3A-3E shows signals associated with operation of an ESD tail current clamp in accordance with various embodiments.
Figure 3B:
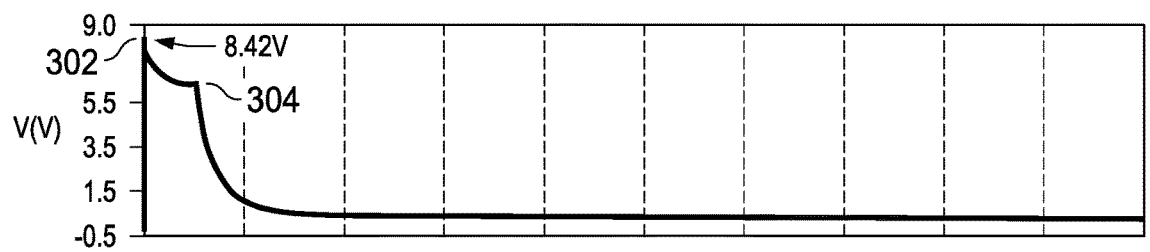
Figure 3C:
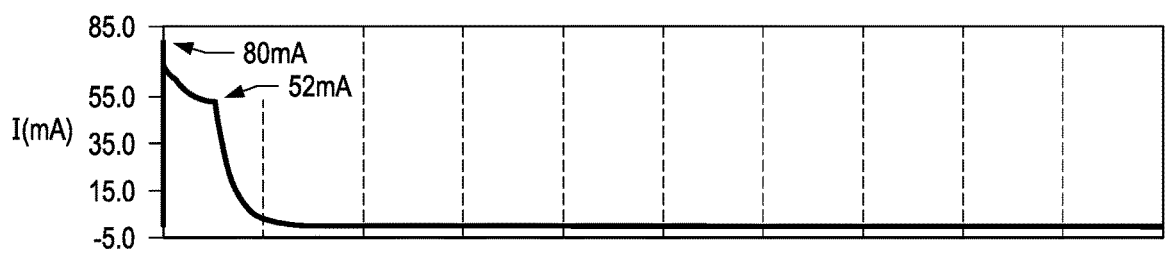
Figure 3D:
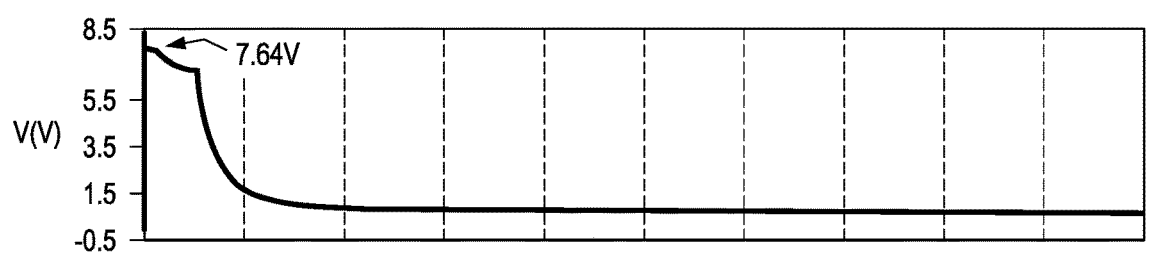
Figure 3E:
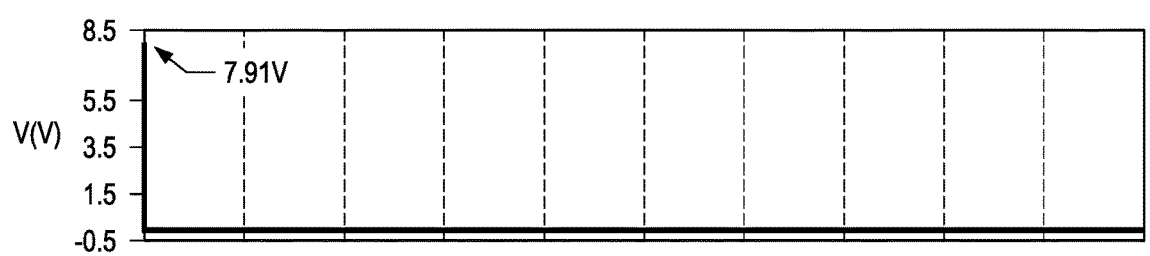

FIGS. 3A-3E shows signals associated with operation of an ESD tail current clamp 104 in accordance with various embodiments. FIG. 3A shows ESD current in accordance with a human body model discharge at the I/O terminal 108. FIG. 3B shows ESD voltage induced at the I/O terminal 108 by the current of FIG. 3A. Both the ESD tail current clamp circuit 104 and the snapback ESD protection device 102 are activated at 302. The snapback ESD protection device 102 turns off at 304. FIG. 3C shows current flow into the ESD tail current clamp circuit 104. FIG. 3D shows the voltage at the control terminal 218 of the shunt transistor 202. FIG. 3E shows the charging pulse applied to the control terminal 222 of the shunt control transistor 204 which charges the control terminal 218 of the shunt transistor 202.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:
1. An electronic circuit, comprising:
an electronic device comprising an input/output (I/O) terminal to receive an input signal or provide an output signal;

a snapback electrostatic discharge (ESD) protection device coupled to the I/O terminal;
an ESD tail current clamp circuit connected in parallel with the snapback ESD protection device, the ESD tail current clamp circuit configured to shunt tail current of an ESD event to a voltage reference, the ESD tail current clamp circuit including a shunt transistor configured to shunt the tail current to the voltage reference;
a control terminal; and
control circuitry coupled to the control terminal, the control circuitry configured to disable the shunt transistor while a control signal is asserted at the control terminal.

2. The electronic circuit of claim 1, wherein the ESD tail current clamp circuit comprises a first control transistor coupled to a control terminal of the shunt transistor; wherein the first control transistor is configured to drive a pulse onto the control terminal of the shunt transistor responsive to the ESD event.

3. The electronic circuit of claim 2, wherein the shunt transistor and the first control transistor are configured to route a voltage induced on the control terminal via the pulse to the voltage reference via a body diode of the first control transistor and a drain-source channel of the shunt transistor.

4. The electronic circuit of claim 2, wherein the shunt transistor is configured to remain active responsive to an ESD induced voltage on the I/O terminal exceeding a threshold voltage of the shunt transistor less a voltage drop across a body diode of the first control transistor.

5. The electronic circuit of claim 2, wherein the ESD tail current clamp circuit comprises a transistor connected as a capacitor configured to detect a transient voltage of the ESD event.

6. The electronic circuit of claim 5, wherein the ESD tail current clamp circuit comprises a second control transistor coupled to the transistor configured as a capacitor, and configured to activate the first control transistor responsive to a pulse generated by the transistor configured as a capacitor.

7. The electronic circuit of claim 1, wherein the ESD tail current clamp circuit is configured to shunt current to the voltage reference after the snapback ESD protection device is disabled.

8. An electrostatic discharge (ESD) protection circuit, comprising:
a snapback ESD protection device configured to shunt current of an ESD event to a voltage reference; and
an ESD tail current clamp circuit connected in parallel with the snapback ESD protection device, the ESD tail current clamp circuit configured to shunt tail current of the ESD event to the voltage reference while the snapback ESD protection device is disabled, the ESD tail current clamp circuit including a shunt transistor configured to shunt the tail current to the voltage reference;
a control terminal; and
control circuitry coupled to the control terminal, the control circuitry configured to disable the shunt transistor while a control signal is asserted at the control terminal.

9. The ESD protection circuit of claim 8, wherein the ESD tail current clamp circuit comprises a first control transistor coupled to a control terminal of the shunt transistor; wherein the first control transistor is configured to drive a pulse onto the control terminal of the shunt transistor responsive to the ESD event.

10. The ESD protection circuit of claim 9, wherein the shunt transistor and the first control transistor are configured to route a voltage induced on the control terminal via the pulse to the voltage reference via a body diode of the first control transistor and a drain-source channel of the shunt transistor.

11. The ESD protection circuit of claim 9, wherein the shunt transistor is configured to remain active responsive to an ESD induced voltage exceeding a threshold voltage of the shunt transistor less a voltage drop across a body diode of the first control transistor.

12. The ESD protection circuit of claim 9, wherein the ESD tail current clamp circuit comprises a transistor connected as a capacitor configured to detect a transient voltage of the ESD event.

13. The ESD protection circuit of claim 12, wherein the ESD tail current clamp circuit comprises a second control transistor coupled to the transistor configured as a capacitor, and configured to activate the first control transistor responsive to a pulse generated by the transistor configured as a capacitor.

14. An ESD tail current clamp circuit, comprising:
a shunt transistor configured to shunt a tail current of an electrostatic discharge (ESD) event to a voltage reference;
a first control transistor coupled to a control terminal of the shunt transistor; wherein the first control transistor drives a pulse onto the control terminal of the shunt transistor responsive to the ESD event;
wherein:
the shunt transistor and the first control transistor route a voltage induced on the control terminal via the pulse to the voltage reference via a body diode of the first control transistor and a drain-source channel of the shunt transistor; and
the shunt transistor remains active responsive to an ESD induced voltage exceeding a threshold voltage of the shunt transistor less a voltage drop across the body diode of the first control transistor.

15. The ESD tail current clamp circuit of claim 14, further comprising:
a control terminal; and
control circuitry coupled to the control terminal, wherein the control circuitry disables the shunt transistor and the first control transistor responsive to assertion of a control signal at the control terminal.

16. The ESD tail current clamp circuit of claim 14, further comprising:
a transistor connected as a capacitor that detects a transient voltage of the ESD event; and
a second control transistor coupled to the transistor connected as a capacitor, wherein the second control transistor activates the first control transistor responsive to a pulse generated by the transistor connected as a capacitor.

* * * * *